United States Patent
Aliane et al.

(10) Patent No.: US 10,090,455 B2
(45) Date of Patent: Oct. 2, 2018

(54) PIEZOELECTRIC DEVICE

(71) Applicant: Commissariat à l'Énergie Atomique et aux Énergies Alternatives, Paris (FR)

(72) Inventors: Abdelkader Aliane, Grenoble (FR); Marine Galliari, Grenoble (FR); Laurent Tournon, Saint Egreve (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 267 days.

(21) Appl. No.: 15/048,929

(22) Filed: Feb. 19, 2016

(65) Prior Publication Data

US 2016/0247999 A1 Aug. 25, 2016

(30) Foreign Application Priority Data

Feb. 23, 2015 (FR) ...................................... 15 51520

(51) Int. Cl.
| | |
|---|---|
| H01L 41/04 | (2006.01) |
| H01L 41/113 | (2006.01) |
| H01L 41/047 | (2006.01) |
| H01L 41/08 | (2006.01) |
| H01L 41/193 | (2006.01) |
| G01L 1/16 | (2006.01) |

(52) U.S. Cl.
CPC ............ H01L 41/1132 (2013.01); G01L 1/16 (2013.01); H01L 41/047 (2013.01); H01L 41/0478 (2013.01); H01L 41/081 (2013.01); H01L 41/193 (2013.01)

(58) Field of Classification Search
CPC .. G01L 1/16; H03H 9/02661; H03H 9/02653; H03H 9/02535
USPC .......................................................... 310/313
See application file for complete search history.

(56) References Cited

U.S. PATENT DOCUMENTS

| | | | | |
|---|---|---|---|---|
| 3,689,784 A | * | 9/1972 | De Klerk | H03H 9/0004 310/313 B |
| 4,802,371 A | * | 2/1989 | Calderara | G01L 1/16 310/338 |
| 5,043,620 A | * | 8/1991 | Mitsutsuka | G06G 7/195 310/313 D |
| 6,337,835 B1 | | 1/2002 | Spron et al. | |
| 2006/0016055 A1 | | 1/2006 | Wilkie et al. | |

(Continued)

FOREIGN PATENT DOCUMENTS

| | | | | |
|---|---|---|---|---|
| EP | 0649116 A1 | * | 4/1995 | ............... G01L 1/16 |
| JP | WO 9302342 A1 | * | 2/1993 | ............... G01L 1/16 |
| WO | WO 2006/057987 A1 | | 6/2006 | |

OTHER PUBLICATIONS

Search Report, dated Jan. 7, 2016, from corresponding French Application No. 15/51520.

*Primary Examiner* — J. San Martin
(74) *Attorney, Agent, or Firm* — Wolf, Greenfield & Sacks, P.C.

(57) ABSTRACT

A piezoelectric device including a substrate, at least two electrodes extending on the substrate, at least one piezoelectric strip extending on the substrate and on the electrodes, and at least one electrically-conductive strip extending at least on one of the electrodes and on the piezoelectric strip and in contact with the substrate on either side of the piezoelectric strip.

10 Claims, 4 Drawing Sheets

(56) References Cited

U.S. PATENT DOCUMENTS

| | | | |
|---|---|---|---|
| 2006/0107749 A1* | 5/2006 | Liu | A61B 5/0002 73/754 |
| 2009/0184381 A1* | 7/2009 | Takizawa | G01N 5/02 257/414 |
| 2015/0096878 A1 | 4/2015 | Aliane et al. | |
| 2017/0261386 A1* | 9/2017 | Keyes | F41H 1/02 |

* cited by examiner

PIEZOELECTRIC DEVICE

CROSS-REFERENCE TO RELATED APPLICATIONS

This application claims the priority benefit of French patent application number 15/51520, filed on Feb. 23, 2015, which is hereby incorporated by reference in its entirety to the maximum extent allowable by law.

BACKGROUND

The present disclosure relates to a piezoelectric device based on organic materials, particularly a pressure sensor, and a method of manufacturing such a device.

Discussion of the Related Art

Patent application WO2006/057987 describes a pressure sensor comprising a piezoelectric film made of an organic material formed on a substrate and covered with two interdigited electrodes. When a pressure is exerted on the substrate, mechanical stress is applied to the piezoelectric film, causing the generation of electric charges therein. The electric charges are recovered by electrodes and provide an electric signal representative of the pressure.

A disadvantage of the pressure sensor described in patent application WO2006/057987 is that it is not adapted to the measurement of high pressures, particularly higher than 10 mbar (1,000 Pa), for example, for a use in a water meter. Indeed, the application of high mechanical stress in the piezoelectric film may cause the separation of the film from the substrate and/or of the electrodes from the film, making the pressure sensor inoperative.

SUMMARY

An object of an embodiment is to overcome all or part of the disadvantages of piezoelectric devices, particularly of the previously-described pressure sensors comprising an organic piezoelectric film.

Another object of an embodiment is that the piezoelectric device is capable of being used as a pressure sensor, particularly for the measurement of high pressures higher than 10 mbar (1,000 Pa) and particularly ranging up to 20 bars (2 MPa).

Another object of an embodiment is that the piezoelectric device may be manufactured at low cost.

Another object of an embodiment is that the piezoelectric device may be formed, at least partly, by printing techniques.

Another object of an embodiment is that the piezoelectric device may be formed on a flexible substrate.

Thus, an embodiment provides a piezoelectric device comprising:
  a substrate;
  at least two electrodes extending on the substrate;
  at least one piezoelectric strip extending on the substrate and on the electrodes; and
  at least one electrically-conductive strip extending at least on one of the electrodes and on the piezoelectric strip and in contact with the substrate on either side of the piezo-electric strip.

According to an embodiment, the device comprises at least two through cavities in said electrode, the piezoelectric strip extending between the cavities and the conductive strip extending in each cavity in contact with the substrate.

According to an embodiment, each electrode comprises fingers, the electrode fingers being interdigited, the sensor further comprising piezoelectric strips each extending on the substrate and on the fingers, and electrically-conductive strips extending on the fingers and on the piezoelectric strips, each conductive strip being in contact with the substrate on either side of each piezoelectric strip.

According to an embodiment, the device comprises through cavities in each finger and, for each finger, each piezoelectric strip extends between two adjacent cavities of the finger, and each conductive strip extends in each cavity of one of the fingers, in contact with the substrate.

According to an embodiment, each piezoelectric strip comprises polyvinylidene fluoride and/or at least one copolymer of polyvinylidene fluoride, particularly a polymer selected from the group comprising polyvinylidene fluoride, poly(vinylidene fluoride-trifluoroethylene), poly(vinylidene fluoride-tetrafluoroethylene), and a mixture of at least two of these polymers.

According to an embodiment, each conductive strip is made of a first organic material.

According to an embodiment, the first organic material comprises more than 90% by weight of carbon.

According to an embodiment, the substrate is made of a second organic material.

According to an embodiment, the second organic material is selected from the group comprising polyethylene naphthalate, polyethylene terephthalate, polyimide, and polyetheretherketone.

According to an embodiment, each cavity further extends in the substrate across a portion of the thickness of the substrate.

The foregoing and other features and advantages will be discussed in detail in the following non-limiting description of specific embodiments in connection with the accompanying drawings.

DETAILED DESCRIPTION

The same elements have been designated with the same reference numerals in the different drawings and, further, the various drawings are not to scale. For clarity, only those elements which are useful to the understanding of the described embodiments have been shown and are detailed. In particular, the devices for processing the signals provided by the temperature sensor are well known by those skilled in the art and are not described in detail. Unless otherwise specified, expressions "approximately", "substantially", and "in the order of" mean to within 10%, preferably to within 5%. In the following description, expression element "based on polyvinylidene fluoride (PVDF)" means a copolymer comprising at least 70% by molar mass of the vinylidene fluoride monomer (VDF) and possibly of at least another monomer such as, for example, trifluoroethylene (TrFE) or tetrafluoroethylene (TFE).

Embodiments of a piezoelectric device adapted to the forming of a pressure sensor will be described. It should however be clear that the piezoelectric device may be used for other applications, for example, to form a power recovery device.

Figure 1A:
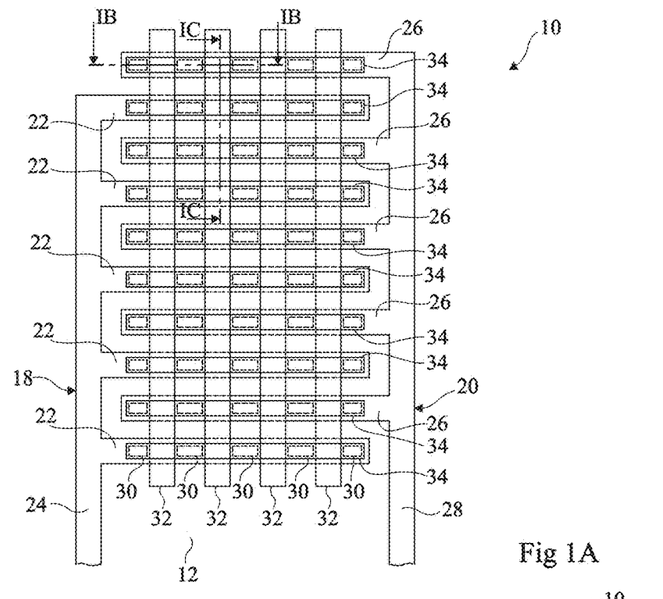
FIGS. 1A, 1B, and 1C respectively are a partial and simplified top view and side cross-section views along two perpendicular cross-section planes of an embodiment of a pressure sensor.
Figure 1B:
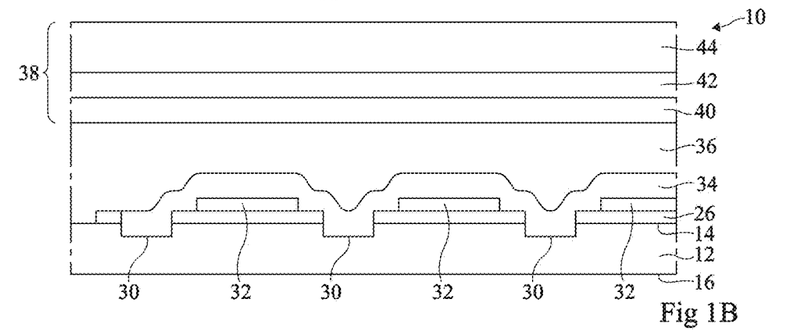
Figure 1C:
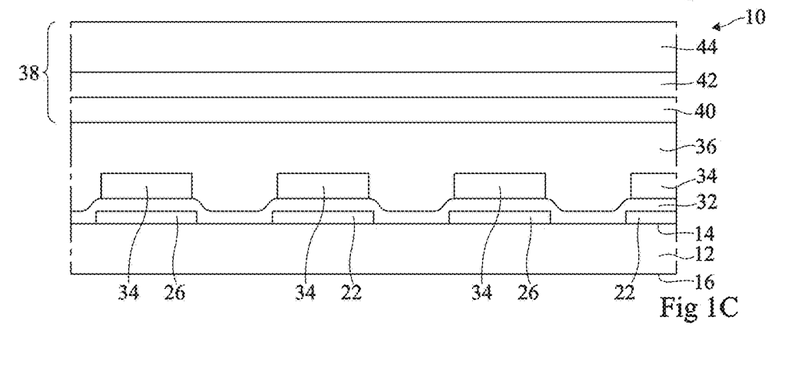

FIGS. 1A, 1B, and 1C respectively are a partial and simplified top view and side cross-section views along two perpendicular cross-section planes of an embodiment of a pressure sensor 10. The cross-section planes of FIGS. 1B and 1C are perpendicular. In FIG. 1A, certain layers of the pressure sensor 10 are not shown. Further, in FIG. 1A, the contours of an element covered with another element are shown in dotted lines.

Pressure sensor 10 comprises, from bottom to top in FIGS. 1B and 1C:
  a substrate 12 comprising two opposite surfaces 14, 16;
  two interdigited electrodes 18, 20 extending on surface 14 of substrate 12 in contact with surface 14 of substrate 12, where electrode 18 is not in contact with electrode 20, electrode 18 comprising parallel fingers 22 connected to a track 24 and electrode 20 comprising fingers 26 parallel to fingers 22 and connected to a track 28, each finger 22, possibly except for one or two fingers 22, being interposed between two fingers 26, and each finger 26, possibly except for one or two fingers 26, being interposed between two fingers 22;
  cavities 30 thoroughly crossing each finger 22, 26 and extending into substrate 12 from surface 14 across part of the thickness of substrate 12;
  parallel strips 32 of an organic and piezoelectric material extending on fingers 22 and 26 and on surface 14 of substrate 12 between fingers 22, 26, and in contact with fingers 22, 26 and with surface 14 of substrate 12, piezoelectric strips 32 being oriented substantially perpendicularly to fingers 22, 26;
  parallel strips 34 of an electrically-conductive organic material, strips 34 being oriented parallel to fingers 22, 26, each strip 34 extending on one of fingers 22 or 26, and covering the portions of strips 32 located on said finger 22, 26 and covering the portions of said underlying finger 22, 26 between strips 32;
  an encapsulation layers 36, not shown in FIG. 1A, covering strips 34, strips 32, electrodes 18, 20, and substrate 12; and
  possibly a coating 38, not shown in FIG. 1A, covering encapsulation layer 36 and successively comprising, from bottom to top in FIGS. 1B and 1C, an adhesive layer 40, a barrier layer 42, and a protection layer 44.

The thickness of substrate 12 may be in the range from 100 nm to 1,000 µm, preferably from 25 µm to 300 µm. Substrate 12 may be a rigid substrate or a flexible substrate. A flexible substrate may, under the action of an external force, deform, and particularly bend, without breaking or tearing. An example of a rigid substrate comprises a silicon, germanium, or glass substrate. An example of flexible substrate comprises a film of PEN (polyethylene naphthalate), PET (polyethylene terephthalate), PI (polyimide), or PEEK (polyetheretherketone). Preferably, substrate 12 is a flexible film. It then preferably has a thickness in the range from 100 nm to 10 µm.

Electrodes 18, 20 may be made of indium tin oxide, of a metallic material, particularly silver, gold, nickel, palladium, platinum, aluminum, copper, titanium, or an alloy or mixture of at least two of these materials, of a conductive polymer, for example, poly(3,4-ethylenedioxythiophene): poly(styrene sulfonate) (PEDOT: PSS) or of graphene.

The dimensions of electrodes 18, 20 are adapted to the envisaged application. As an example, each electrode 18, 20 may comprise at least two fingers, particularly approximately 5 fingers. The length of each finger 22, 26 may vary from 20 µm to 10,000 µm, particularly approximately 4,000 µm. The width of each finger 22, 26 may vary from 20 µm to 300 µm, particularly approximately 50 µm. The spacing between a finger 22 of electrode 18 and the closest finger of electrode 20 may vary from 1 µm to 200 µm, for example, approximately 2 µm. The thickness of each finger 22, 26 may vary from 10 nm to 300 nm, for example, approximately 100 nm.

Cavities 30 may have, in top view, a circular, elliptic, or polygonal shape, particularly square or rectangular. As an example, cavities 30 may, in top view, have the shape of a rectangle having a large side measuring from 10 µm to 900 µm, particularly approximately 300 µm and a small side measuring from 5 µm to 300 µm, particularly approximately 100 µm.

Piezoelectric strips 32 may be made of a PVDF-based compound. The PVDF-based compound may comprise the PVDF polymer alone, a single copolymer of PVDF, a mixture of two or more than two copolymers of PVDF, a mixture of the PVDF polymer and of at least one copolymer of PVDF. Preferably, the copolymer of PVDF is poly (vinylidene fluoride-trifluoroethylene) (P(VDF-TrFE)), particularly P(VDFx-TrFE100−x) where x is a real number between 60 and 80, particularly approximately 70, poly (vinylidene fluoride-tetrafluoroethylene), poly((vinylidene fluoride-trifluoroethylene-chlorofluoroethylene) (P(VDF-TrFE-CFE), or poly((vinylidene fluoride-trifluoroethylene-chlorotrifluoro-ethylene) (P(VDF-TrFE-CTFE).

The PVDF-based compound may further comprise fillers. The fillers may correspond to ceramic particles, for example, baryum titanate particles (BaPiO3), lead zirconate titanate particles (PbZrTiO3 or PZT), lead titanate particles (PbTiO3), or lithium tantalate particles (LiTaO3). The concentration by weight of fillers in the PVDF-based compound may vary from 5% to 25%.

The compound may thus comprise a mixture of the PVDF polymer and of at least one ceramic or a mixture of at least one copolymer of PVDF and of at least one ceramic, for example, the following mixtures: PVDF/BaTiO3, P(VDF-TrFE)/BaTiO3, P(VDF-TrFE-CTFE)/BaTiO3, P(VDF-TrFE-CFE)/BaTiO3, PVDF/PbZrTiO3, P(VDF-TrFE)/PbZrTiO3, P(VDF-TrFE-CTFE)/PbZrTiO3, P(VDF-TrFE-CFE)/PbZrTiO3, PVDF/PbTiO3, P(VDF-TrFE)/PbTiO3, P(VDF-TrFE-CTFE)/PbTiO3, P(VDF-TrFE-CFE)/PbTiO3, PVDF/LiTaO3, P(VDF-TrFE)/LiTaO3, P(VDF-TrFE-CTFE)/LiTaO3, P(VDF-TrFE-CFE)/LiTaO3.

The width of each piezoelectric strip 32 may vary from 20 µm to 300 µm, for example, approximately 100 µm. The spacing between two adjacent strips 32 may vary from 10 µm to 500 µm, for example, approximately 400 µm. The thickness of each strip 32 may vary from 100 nm to 10 µm, for example, approximately 4 µm.

Conductive strips 34 may be made of an electrically-conductive carbon material. A carbon material is a material comprising more than 80%, preferably more than 90%, by weight of carbon. The carbon material may correspond to the product obtained after the drying of a carbon ink or may correspond to conductive graphene or to a mixture of carbon black and of a silver ink. The carbon ink may be carbon ink commercialized by Creative Materials under reference 112-48. Preferably, the carbon material has a Young' modulus smaller than 10 GPa. The resistance per square of each conductive strip 34 varies from 1 ohm/□ to 50 ohm/□. The material forming conductive strips 24 has a good adhesion to substrate 12. According to an embodiment, the peeling force of a conductive strip 34, along a peeling angle greater than 45°, adhering to substrate 12 is greater than 30 N for a 25-mm adhesive width.

The length of each conductive strip 34 may be substantially the same as that of a finger 22, 26, for example, from 50 µm to 10,000 µm, for example, approximately 4,000 µm. The width of each conductive strip 34 may be substantially the same as that of a finger 22, 26, for example, from 20 µm to 300 µm, for example, approximately 100 µm. The thickness of each conductive strip 34 may vary from 1 µm to 20 µm, for example, approximately 4 µm.

Encapsulation layer 36 may be made of polydimethylsiloxane (PDMS) or of poly(methyl methacrylate) (PMMA). The thickness of encapsulation layer 36 may vary from 10 µm to 2 mm.

Adhesive layer 40 may be a pressure-sensitive adhesive (PSA). Examples of pressure-sensitive adhesives are based on polyacrylates, or polydienes, or based on triblock polymers such as styrene-isoprene-styrene (SIS) or styrene-butadiene-styrene (SBS). Preferably, the material forming encapsulation layer 36 has a Young's modulus smaller than 1 GPa. The thickness of the adhesive layer may be approximately 25 µm.

Barrier layer 42 may comprise a stack of at least one layer of an inorganic material and of at least one layer of an organic material. Examples of inorganic materials are silicon nitride, aluminum nitride, aluminum oxide, silicon oxide, and mixtures of at least two of these compounds. Examples of organic materials are polyacrylates. The thickness of barrier layer 42 may vary from 10 nm to 500 nm.

Protection layer 44 may comprise a flexible film made of PEN (polyethylene naphthalate), PET (polyethylene terephthalate), PI (polyimide), or PEEK (polyetheretherketone). Protection layer 44 preferably has a thickness in the range from 10 µm to 50 µm.

In operation, when a pressure is applied to substrate 12, piezoelectric strips 32 are mainly deformed along a direction parallel to surface 14 of substrate 12, that is, the piezoelectric strips operate mainly according to a {31} transverse mode.

Each conductive strip 34 is anchored to substrate 12 by the areas of contact between each conductive strip 34 and substrate 12 in cavities 30. Thereby, each conductive strip 34 takes part in maintaining piezoelectric strips 32 against electrodes 18, 20 and substrate 12 and in maintaining fingers 22, 26 against substrate 12. Conductive strips 34 thus decrease risks of separation of piezoelectric strips 32 and/or of electrodes 18, 20 when the mechanical stress exerted on piezoelectric strips 32 is high. Pressure sensor 10 may in particular enable to measure pressures varying from 10 mbar (1,000 Pa) to approximately 20 bars (2*106 Pa).

An embodiment of a method of manufacturing sensor 10 will now be described in relation with FIGS. 2A to 5C.

Figure 2A:
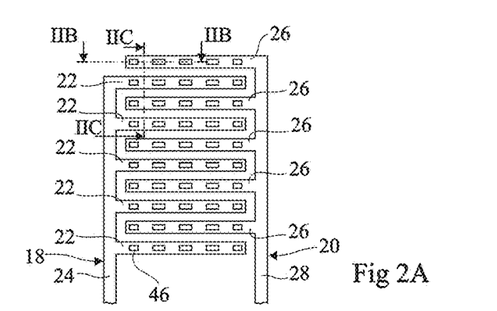
FIGS. 2A, 2B, and 2C are views similar to FIGS. 1A, 1B, and 1C respectively after a step of an embodiment of a method of manufacturing the pressure sensor shown in FIGS. 1A, 1B, and 1C.
Figure 2B:
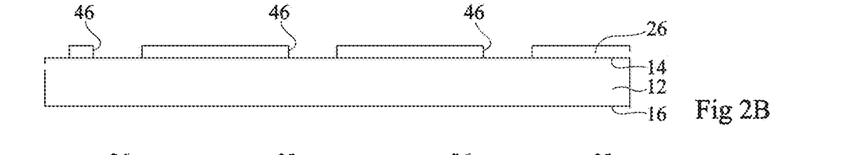
Figure 2C:
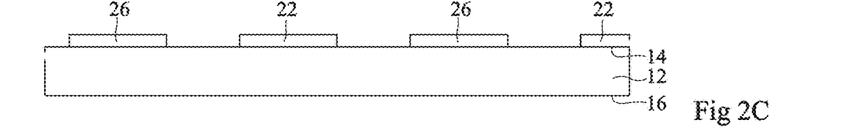

FIGS. 2A, 2B, and 2C are views similar to FIGS. 1A, 1B, and 1C respectively after having formed electrodes 18, 20 on substrate 12. According to the material forming electrodes 18, 20, the method of forming electrodes 18, 20 may correspond to a so-called additive process, for example, by direct printing of a fluid or viscous composition comprising the material forming electrodes 18, 20 at the desired locations, for example, by inkjet printing, heliography, silk-screening, flexography, spray coating, or drop-casting. According to the material forming electrodes 18, 20, the method of forming electrodes 18, 20 may correspond to a so-called subtractive process, where the material forming electrodes 18, 20 is deposited over the entire structure and where the non-used portions are then removed, for example, by photolithography or laser ablation. According to the considered material, the deposition over the entire structure may be performed, for example, by liquid deposition, by cathode sputtering, or by evaporation. Methods such as spin coating, spray coating, heliography, slot-die coating, blade coating, flexography, or silk-screening, may in particular be used. According to the implemented deposition method, a step of drying the deposited materials may be provided.

When the forming of electrodes 18, 20 comprises a step of physical vapor deposition, the method comprises depositing a conductive layer on surface 14 of substrate 12 and etching this layer to delimit electrodes 18, 20. The etching may comprise a photolithography step. As an example, in the case where electrodes 18, 20 are made of gold, the etching may be a chemical etching with potassium iodide. In particular, the etch step causes the forming of openings 46 in each finger 22, 26 which expose portions of surface 14 of substrate 12.

Figure 3A:
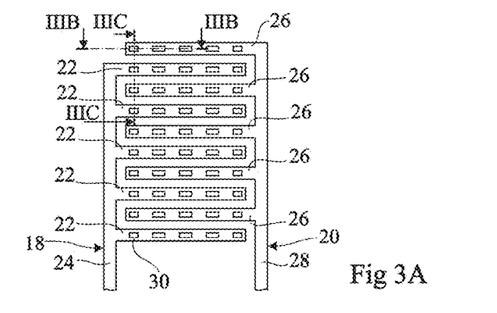
FIGS. 3A, 3B, and 3C are views similar to FIGS. 2A, 2B, and 2C respectively after a subsequent step of an embodiment of a method of manufacturing the pressure sensor shown in FIGS. 1A, 1B, and 1C.
Figure 3B:
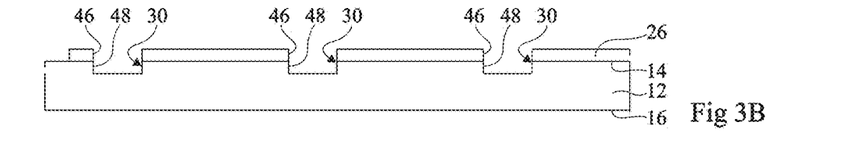
Figure 3C:
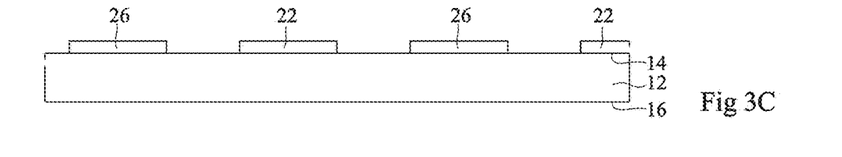

FIGS. 3A, 3B, and 3C are views similar to FIGS. 2A, 2B, and 2C respectively after a step of etching openings 48 in substrate 12 in line with openings 46. The depth of each opening 48 may vary from 1 µm to 10 µm. The etching of openings 48 may comprise a photolithography step. Openings 46 and 48 form previously-described cavities 30. In the case where substrate 12 is made of PEN, the etching may be an etching using an oxygen plasma.

Figure 4A:
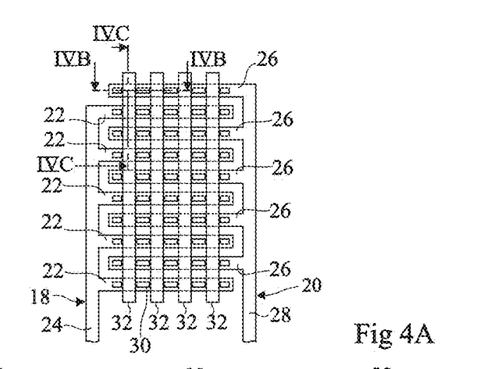
FIGS. 4A, 4B, and 4C are views similar to FIGS. 3A, 3B, and 3C respectively after a subsequent step of an embodiment of a method of manufacturing the pressure sensor shown in FIGS. 1A, 1B, and 1C.
Figure 4B:
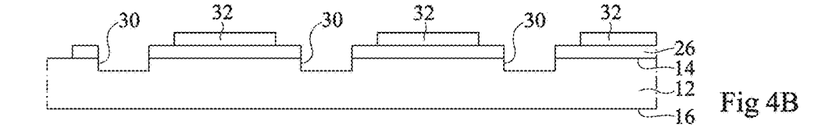
Figure 4C:
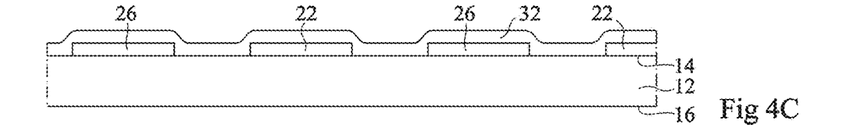

FIGS. 4A, 4B, and 4C are views similar to FIGS. 3A, 3B, and 3C respectively after the forming of piezoelectric strips 32. The method may comprise depositing a first liquid composition, possibly viscous, and then a step of crystallizing the PVDF-based compound to form piezoelectric strips 32.

The first liquid composition comprises a first solvent and a compound based on PVDF dissolved in the first solvent. Preferably, the first solvent is a polar solvent. This advantageously enables to improve the dissolution of the PVDF-based polymer. Preferably, the first solvent is capable of absorbing, at least partially, the UV radiation, for example, over a wavelength range between 200 nm and 400 nm. According to an embodiment, the evaporation of the first solvent is in the range from 110° C. to 140° C., preferably from 110° C. to 130° C., more preferably from 120° C. to 130° C. The first solvent may be selected from the group comprising cyclopentanone, dimethylsulphoxide (DMSO), dimethylformamide (DMF), dimethylacetamide (DMAc), or N-methyl-E-pyrrolidone (NMP). Preferably, the first solvent is cyclopentanone.

The first composition may comprise from 1% to 30%, preferably from 1% to 30%, preferably from 10% to 25%, in particular approximately 20%, by weight of the PVDF-based compound and from 70% to 99%, preferably from 75% to 90%, in particular approximately 80%, by weight of the first solvent. Advantageously, the concentration by weight of the first solvent is selected to adjust the viscosity of the first obtained composition to enable to implement printing techniques. The method of forming piezoelectric strips 32 may correspond to a so-called additive method such as previously described, particularly by inkjet, silk-screening, or spray coating. The method of forming piezoelectric strips 32 may further correspond to a so-called subtractive method such as previously described. When the deposition method comprises a silk-screening step, the viscosity of the first composition may vary from 5 Pa·s to 30 Pa·s.

The step of crystallizing the PVDF-based compound may comprise an anneal carried out at a temperature in the range from 100° C. to 130° C. for from 10 minutes to 30 minutes. According to another embodiment, the crystallization step may comprise an ultraviolet ray (UV) irradiation of the first composition by a succession of UV radiation pulses, or ultraviolet flashes. UV radiation means a radiation having its wavelengths at least partly in the range from 200 nm to 400 nm. According to an embodiment, the duration of a UV pulse is in the range from 500 µs to 2 ms. The duration between two successive UV pulses may be from 1 to 5 seconds. The fluence of the UV radiation may be in the range from 10 J/cm2 to 25 J/cm2. The number of UV pulses particularly depends on the thickness of piezoelectric strips 32. As an example, for a 100-nm thickness of piezoelectric strips 32, the number of UV pulses may be in the range from 1 to 2 with a fluence between 10 J/cm2 and 15 J/cm2 and for a thickness of piezoelectric strips 32 in the order of 4 µm, the number of UV pulses may be in the range from 2 to 6 with a fluence between 17 J/cm2 and 21 J/cm2.

Advantageously, during the irradiation of the first composition, electrodes 18, 20 reflect part of the UV radiation having crossed the first composition. This enables to improve the quantity of UV radiation received by the first composition. Advantageously, the first solvent of the first composition at least partly absorbs UV radiation. This enables to improve the heating of the compound based on UVs and of favoring the forming of crystal phase β, which is the phase capable of having pyroelectric and piezoelectric properties. The evaporation temperature of the first solvent is advantageously higher than 110° C. to avoid too fast an evaporation of the first solvent before the forming of crystal phase β which occurs between 120° C. and 130° C. Preferably, the irradiation step causes an evaporation of more than 50% by weight, preferably of more than 80% by weight, of the first solvent of the first composition.

Figure 5A:
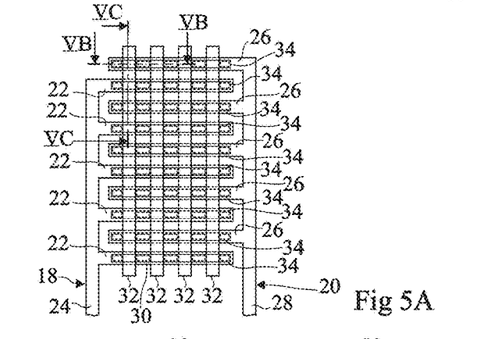
FIGS. 5A, 5B, and 5C are views similar to FIGS. 4A, 4B, and 4C respectively after a subsequent step of an embodiment of a method of manufacturing the pressure sensor shown in FIGS. 1A, 1B, and 1C.
Figure 5B:
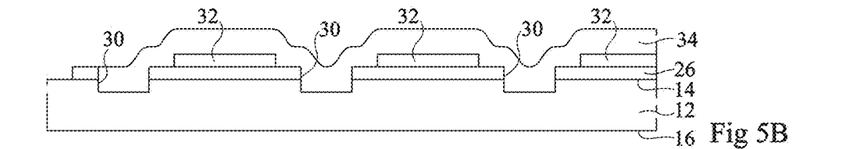
Figure 5C:
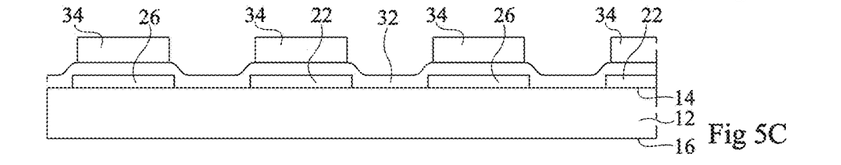

FIGS. 5A, 5B, and 5C are views similar to FIGS. 4A, 4B, and 4C respectively after a step of forming conductive strips 34. The method may comprise depositing a second first liquid composition, possibly viscous, and then a drying step to form conductive strips 34. The second liquid composition comprises a second solvent and a compound based on a carbon material dissolved in the second solvent. The second solvent is selected so as not to chemically react with the material forming piezoelectric strips 32. The second solvent may be selected from the group comprising cyclohexane, chloroform, tetrahydrofuran, ethyl acetate, and xylene.

The second composition may comprise from 5% to 30% by weight of the carbon compound and from 85% to 70% by weight of the second solvent. Advantageously, the concentration by weight of the second solvent is selected to adjust the viscosity of the second obtained composition to enable to implement printing techniques. The method of forming conductive strips 34 may correspond to a so-called additive method such as previously described, particularly by inkjet, silk-screening, or spray coating. The method of forming the portion made of the second composition may further correspond to a so-called subtractive method such as previously described. The step of drying the second composition may comprise an anneal performed at a temperature in the range from 90° C. to 130° C. during from 10 minutes to 30 minutes.

A subsequent step of the embodiment of the manufacturing method may comprise forming encapsulation layer 36 on the structure obtained at the previous step. Encapsulation layer 36 may be deposited by silk-screening. An anneal step may be provided, for example, at a temperature in the range from 60° C. to 80° C. for a time period varying from 30 minutes to several hours.

For certain applications, particularly when sensor 10 is placed in an aqueous fluid, it may be desirable to improve the sensor protection against humidity. An embodiment of the manufacturing method may then comprise an additional step of bonding coating 38 to the encapsulation layer. The stack comprising protection layer 44 and barrier layer 42 may be formed separately and be bonded to the encapsulation layer by adhesive layer 40, for example, by a calendering step.

For certain applications, to improve the piezoelectric characteristics of strips 32 based on PVDF, a continuous electric field may be applied to piezoelectric strips 32 with an intensity varying from 20 V/µm to 80 V/µm for a plurality of minutes at 25° C. or at a higher temperature, for example, between 80° C. and 100° C. According to another embodiment, the piezoelectric characteristics of strips 32 based on PVDF may be improved by applying a Corona treatment to piezoelectric strips 32.

Figure 6:
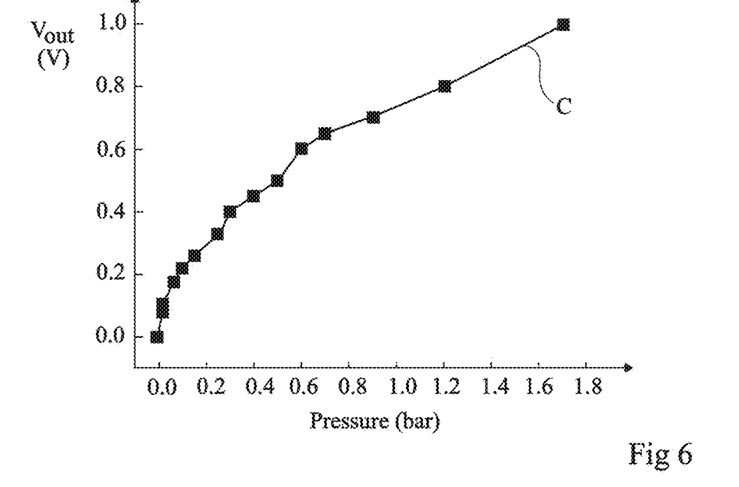
FIG. 6 shows a curve of the variation of the voltage provided by a pressure sensor according to the embodiment shown in FIGS. 1A, 1B, and 1C according to the pressure exerted on the sensor substrate.

FIG. 6 shows a curve C of variation of the voltage measured between electrodes 18, 20 of pressure sensor 10 according to the pressure applied to substrate 12. Curve C has been obtained for a pressure sensor 10 having the following dimensions and structure:

substrate 12 is made of PEN and has a 125-µm thickness;
electrodes 18, 20 are made of gold, with a 30-nm thickness and each comprises five fingers, each having a 4,000-µm length and a 300-µm width with cavities 30 each having, in top view, the shape of a rectangle having a 300-µm large side and a 100-µm small side;
piezoelectric strips 32 are made of P(VDF30-TrFE70) and are by the number of 4, spaced apart by 200 µm from one another, with a 100-µm width and a 4-µm thickness; and
conductive strips 34 are made of carbon ink and have a 4-µm thickness.

Curve C shows the proper operation of pressure sensor 10 at least up to a 2-bar pressure (0.2 MPa).

Figure 7:
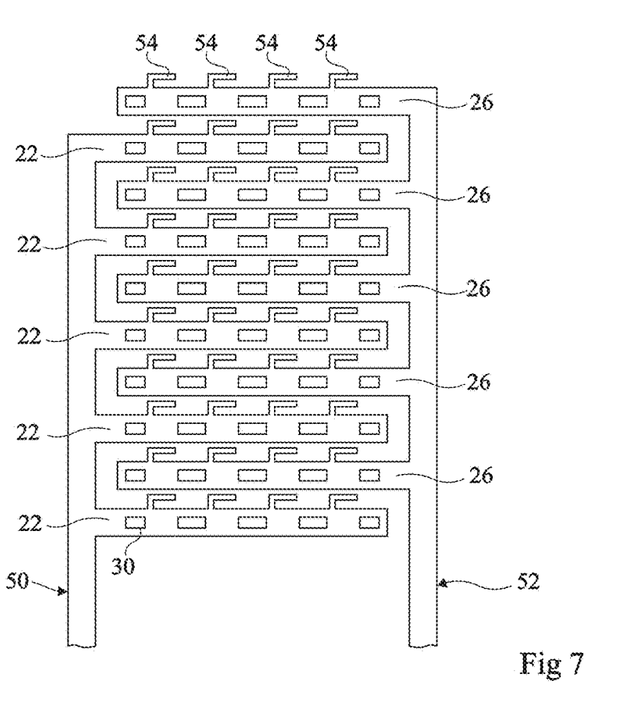
FIG. 7 is a top view of the electrodes of a pressure sensor according to another embodiment.

FIG. 7 is a partial simplified top view of another embodiment of electrodes 50, 52. Electrodes 50, 52 comprise all the elements of previously-described electrodes 18, 20 and further comprise, for each finger 22, 26, pins 54 which are connected to finger 22, 24 and extend in parallel fashion between the finger to which they are connected and the adjacent finger. Pins 54 are not connected to one another. Each pin 54 is partly covered with one of piezoelectric strips 32. According to an embodiment, each electrode 50, 52 comprises, for each finger 22, 26, as many pins 54 as there are piezoelectric strips 32. Pins 54 enable to improve the recovery by electrodes 50, 52 of the electric charges generated in the piezoelectric strips.

Specific embodiments have been described. Various alterations, modifications, and improvements will occur to those skilled in the art. In particular, although, in the previously-described embodiments, the cavities extend in substrate 12 across part of the substrate thickness, it is possible for cavities 30 not to penetrate into substrate 12 but to stop at the surface of substrate 12. Conductive strips 34 are then anchored to surface 14 of substrate 12 in each cavity 30.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A piezoelectric device comprising:
   a substrate;
   at least two electrodes extending on the substrate;
   at least one piezoelectric strip extending on the substrate and on the electrodes; and
   at least one electrically-conductive strip extending at least on one of the electrodes and on the piezoelectric strip and in contact with the substrate on at least two sides of the piezoelectric strip.

2. The device of claim 1, comprising at least two through cavities in said electrode, the piezoelectric strip extending between the cavities and the conductive strip extending in each cavity in contact with the substrate.

3. The device of claim 1, wherein each electrode comprises fingers, the electrode fingers being interdigited, the device further comprising piezoelectric strips each extending on the substrate and on the fingers, and electrically-conductive strips extending on the fingers and on the piezoelectric strip, each conductive strip being in contact with the substrate on either side of each piezoelectric strip.

4. The device of claim 3, comprising through cavities in each finger and wherein, for each finger, each piezoelectric strip extends between two adjacent cavities of the finger, and each conductive strip extends in each cavity of one of the fingers, in contact with the substrate.

5. The device of claim 1, wherein each piezoelectric strip comprises polyvinylidene fluoride and/or at least one copolymer of polyvinylidene fluoride, particularly a polymer selected from the group comprising polyvinylidene fluoride, poly(vinylidene fluoride-trifluoroethylene), poly(vinylidene fluoride-tetrafluoroethylene), and a mixture of at least two of these polymers.

6. The device of claim 1, wherein each conductive strip is made of a first organic material.

7. The device of claim 6, wherein the first organic material comprises more than 90% by weight of carbon.

8. The device of claim 6, wherein the substrate is made of a second organic material.

9. The device of claim 8, wherein the second organic material is selected from the group comprising polyethylene naphthalate, polyethylene terephthalate, polyimide, and polyetheretherketone.

10. The device of claim 1, wherein each cavity further extends in the substrate across a portion of the thickness of the substrate.

* * * * *